(12) United States Patent
Bui

(10) Patent No.: US 6,320,391 B1
(45) Date of Patent: Nov. 20, 2001

(54) INTERCONNECTION DEVICE FOR LOW AND HIGH CURRENT STRESS ELECTROMIGRATION AND CORRELATION STUDY

(75) Inventor: Nguyen D. Bui, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/076,219

(22) Filed: May 8, 1998

(51) Int. Cl.[7] .......................... G01N 27/20; G01R 27/08; G01R 31/02
(52) U.S. Cl. .......................... 324/537; 324/713; 324/718; 324/760
(58) Field of Search .................. 324/525, 531, 324/537, 760, 713, 715, 718, 719

(56) References Cited

U.S. PATENT DOCUMENTS 5,712,510 * 1/1998 Bui ........................................ 257/758
5,900,735 * 5/1999 Yamamoto ............................ 324/537

* cited by examiner

Primary Examiner—Glenn W. Brown
(74) Attorney, Agent, or Firm—Davis Chin

(57) ABSTRACT

An interconnection test structure for evaluating more accurately and reliably electromigration characteristics is provided. The test structure includes an elongated metal test conductor having a first end and a second end, small extension metal conductors connected to the first end and the second end of the test conductor, and a plurality of vias disposed in the small extension metal conductors adjacent the first end and the second end of the test conductor. As a result, the current density of the plurality of vias is made to be less than the current density of the test conductor.

15 Claims, 3 Drawing Sheets

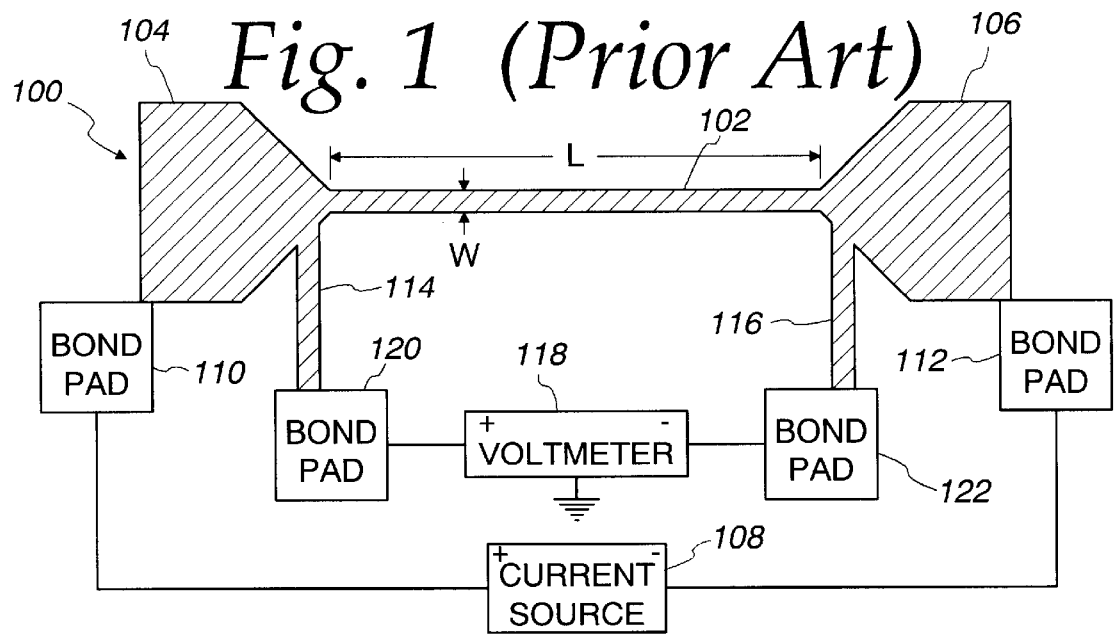
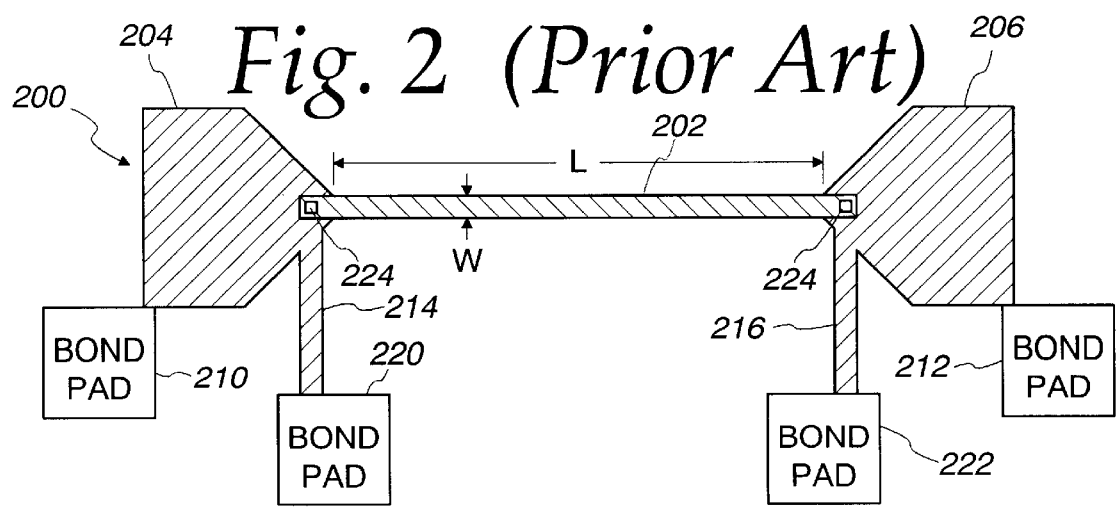
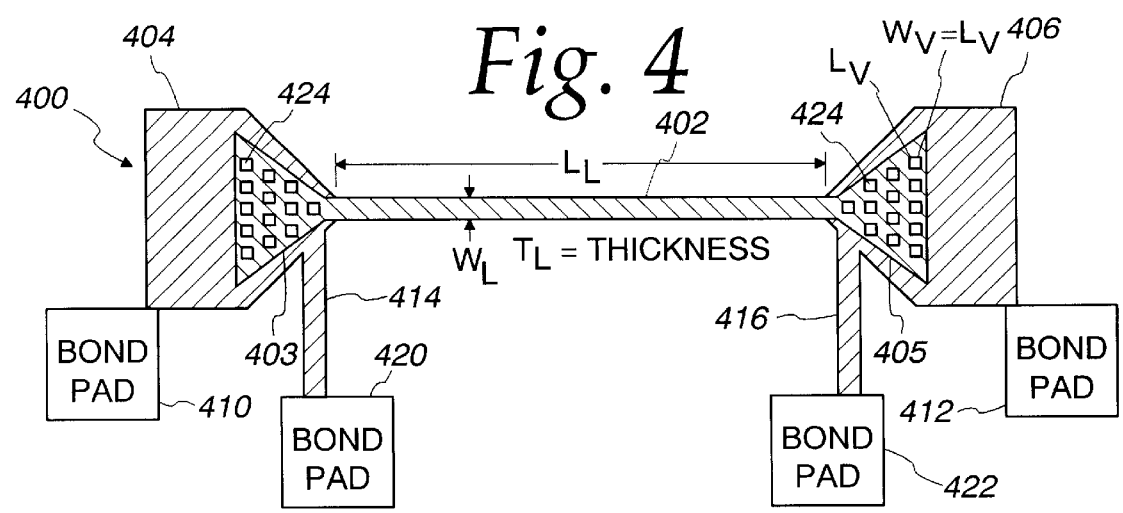

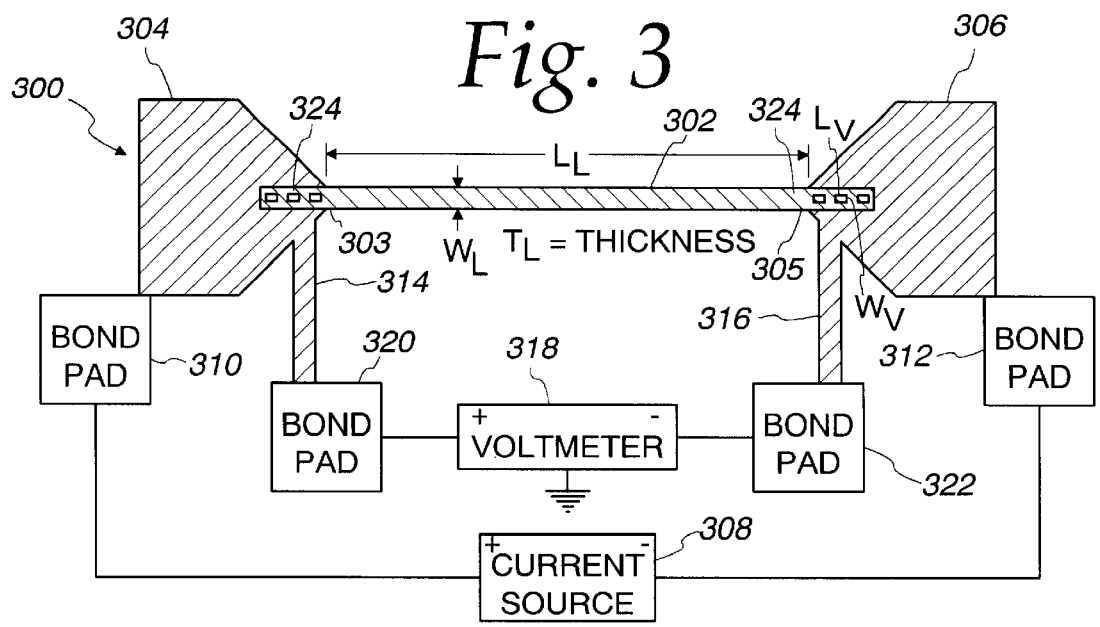
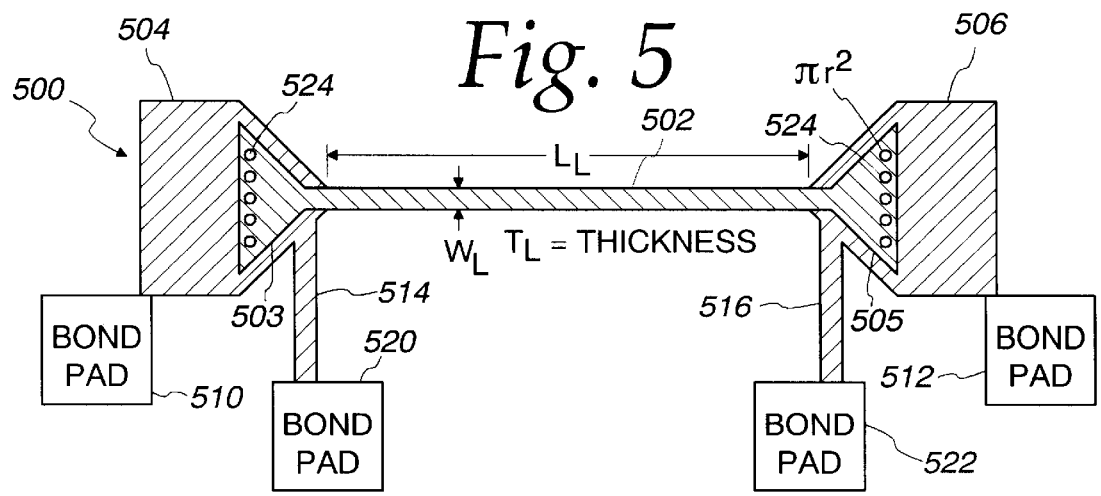
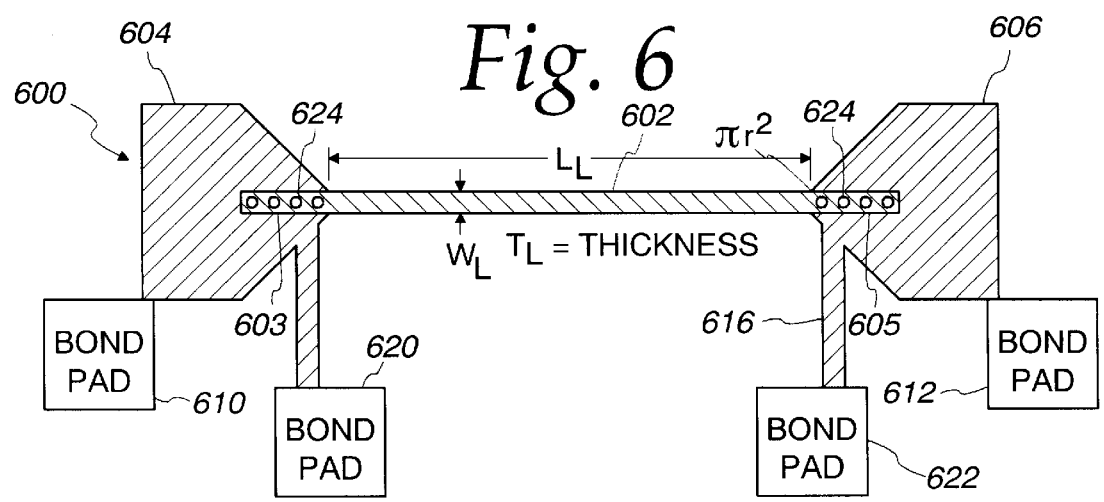

INTERCONNECTION DEVICE FOR LOW AND HIGH CURRENT STRESS ELECTROMIGRATION AND CORRELATION STUDY

BACKGROUND OF THE INVENTION

1. Field of the Invention

This invention relates generally to electromigration test structures and more particularly, it relates to an improved interconnection test structure for evaluating electromigration characteristics in a more accurate and reliable manner.

2. Description of the Prior Art

As semiconductor integrated circuit devices are continuing to be designed with smaller and smaller dimensions so as to accommodate higher integration density such as for VLSI, the metal interconnection lines or wiring are made thinner and longer and the number of such metal interconnection lines is further increasing. Furthermore, in view of the progressive miniaturization of the VLSI semiconductor circuit components and in order to supply electrical current to the high density packed, active regions thereof, two or more metal interconnection levels are required. In addition, the electrical contact between the various metal interconnection levels must be provided through the use of very small holes referred to as "vias," which are typically filled by a metal plug such as tungsten.

As a consequence, the density of the electric current flowing through the vias increases as the integration density increases. This high electric current will cause a diffusion phenomenon to occur referred to as "electromigration" where the metal atoms in the interconnection (metal line) migrate in the same direction as that of the electron movement. When this happens, the resultant metal atom migration will cause an atomic vacancy or void to be formed at the location from which the metal atoms have moved or will cause a hillock to be built up at the location where the metal atoms accumulate. When such voids are formed, the local cross-sectional area of the metal line will be decreased and the local current density in the metal line will be increased, thereby likely to cause a discontinuity or failure of the interconnection. On the other hand, when such hillocks are formed, this may also cause a failure due to a short circuit.

Thus, the electromigration characteristics of the metal conductors (e.g., aluminum, aluminum-alloys, and/or refractory metal) in the semiconductor integrated circuit devices are of a major concern. Accordingly, test methods for evaluating the electromigration resistance of conductors have been developed heretofore. One such traditional test structure 100 that has been adopted by the National Bureau of Standards for determining the electromigration characteristics and thus reliability is illustrated in FIG. 1. Since the entire test structure 100 is located in a single planar surface, this is referred to as a "infinite source" structure.

The electromigration circuit element is comprised of a long, thin metal test conductor or line 102 having larger extension metal conductors 104, 106 joined at each end of the test conductor 102. The larger extension metal conductors 104 and 106 are coupled to an external current source 108 via test or bond pads 110, 112 for applying electrical stressing current to the test conductor 102. The length L of the test conductor 102 is about 800 $\mu$m, and the width W thereof is approximately 0.5 $\mu$m. The thickness of the test conductor is similar to the CMOS process technology used, such as 1 $\mu$m for a 1 micron technology. A pair of narrow transverse conductors 114, 116 are joined adjacent the ends of the test conductor 102. The narrow conductors 114 and 116 are coupled to a grounded voltmeter 118 via test or bond pads 120, 122 for voltage measurements.

Initially, prior to performing the electromigration test the voltmeter 118 is used to measure the resistance of the unstressed test conductor 102 so as to define an "initial" resistance. For the electromigration evaluating test, an electrical stressing current having a specified current density such as about $1 \times 10^6$ amp/cm$^2$ is applied for a preselected amount of time to the test conductor 102 via the test pads 110 and 112 by the current source 108 so as to accelerate electromigration. Then, the stressing current is disconnected and the voltage across the test conductor 102 is measured again by the voltmeter via the test pads 120, 122 to determine its resistance.

This process is repeated over and over until there is a "failure" in the test conductor 102. As used herein, the term "failure" can be defined to be an increased resistance of 20 percent from the original unstressed resistance value. Therefore, the life of the interconnection can be estimated from elapsed time that it takes to cause the failure. Further, the test may be performed on the test conductor 102 which is heated to approximately 200° C. to 300° C. in order to accelerate the deterioration of the interconnection. Nevertheless, even under such conditions the typical test may require many weeks or a month before a failure occurs. As a result, this traditional method is not a practical testing method that can be employed.

In order to greatly shorten the testing period, there have been developed more recently several wafer-level electromigration test methods which utilize considerably higher current density and higher temperatures so as to accelerate the electromigration phenomenon in the interconnections. Such electromigration test techniques include those known as TRACE, SWEAT, Isothermal, and BEM. For example, the term "SWEAT" is an acronym for Standard Wafer Level Electromigration Acceleration Test which provides for a much larger current through the test conductor than the conventional "long-term" test. The SWEAT technique requires a typical time of only about 30 seconds at a current density of 1 to $2 \times 10^7$ amps/cm$^2$ for an aluminum interconnection. However, the SWEAT test has not been widely accepted in the semiconductor industry due to the lack of correlation between the results produced thereby and the results obtained from the more traditional "long-term" test.

Further, the SWEAT or Isothermal test cannot accurately predict the electromigration characteristics on metal interconnections with a single via, as shown in FIG. 2. It will be noted that the test structure 200 of FIG. 2 is identical to the test structure 100 of FIG. 1, except that it contains a single via 224 disposed adjacent each end of the test conductor 202. Further, the test conductor 202 is formed on a different level than the extension conductors 204, 206; the narrow transverse conductors 214, 216; and test pads 210, 212, 220, 222. Accordingly, the test structure 200 of FIG. 2 is used to simulate a high-density semiconductor integrated circuit fabricated with multiple levels of metal interconnections in which metal-filled vias are electrically coupling the various metal interconnection layers. Since the test structure 200 is not contained in a single planar surface, it is referred to as a "finite source" structure.

As previously pointed out, the vias 224 are typically filled with a metal plug which is a refractory material such as tungsten. However, the physical properties of tungsten are substantially different from the physical properties of aluminum or aluminum-alloys forming the metal interconnection line 202. Further, the dimensions of the vias 224 are extremely small and deep and are generally smaller than the metal interconnection line 202. Thus, the test structure 200 of FIG. 2 with a single via 224 located adjacent each end of the test conductor 202 will create a current crowding effect on the via region of the test conductor which leads to electromigration enhancement of the metal near the via. Also, when high current stressing is employed, the via region will experience electromigration failure before the electromigration failure of the metal interconnection line. Further, the area underneath the via may also fail initially before the electromigration failure of the metal interconnection line due to the intersection of grain boundaries (triple point).

Therefore, there is still a need for an interconnection test structure for evaluating accurately and reliably electromigration characteristics. Further, it will be expedient that the high current stressing performed on the wafer-level be capable of being correlated so as to predict electromigration characteristics in low current stressing performed on a fully assembled package chip.

SUMMARY OF THE INVENTION

Accordingly, it is a general object of the present invention to provide an improved interconnection test structure for evaluating electromigration characteristics which overcomes the problems encountered in the prior art test structures.

It is an object of the present invention to provide an improved interconnection test structure for evaluating electromigration characteristics on a more accurate and reliable manner.

It is another object of the present invention to provide an improved interconnection test structure using high current stress for evaluating electromigration characteristics in an interconnection device having vias.

It is still another object of the present invention to provide an improved interconnection test structure for evaluating an interconnection device for determining gross defects and for performing correlations study between high current stress and low current stress for defect detection and material characterization.

In accordance with these aims and objectives, the present invention is concerned with the provision of an interconnection test structure using high stress current for evaluating more accurately and reliably electromigration characteristics. An elongated metal test conductor having a first end and a second end is provided. Small extension metal conductors are connected to the first end and the second end of the test conductor. A plurality of vias are disposed in the small extension metal conductors adjacent the first end and the second end of the test conductor so as to cause the current density of the plurality of vias to be less than the current density of the test conductor. As a result, failure of the test conductor due to electromigration will occur before failure of the vias due to the electromigration.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a block diagram of a conventional "infinite source" test structure of the prior art;

FIG. 2 is a block diagram of a conventional "finite source" test structure of the prior art;

FIG. 3 is a block diagram of an interconnection test structure, constructed in accordance with the principles of the present invention;

FIG. 4 is a second embodiment of an interconnection test structure of the present invention;

FIG. 5 is a third embodiment of an interconnection of the present invention;

FIG. 6 is a fourth embodiment of an interconnection test structure of the present invention;

DESCRIPTION OF THE PREFERRED EMBODIMENT

Figure 7:
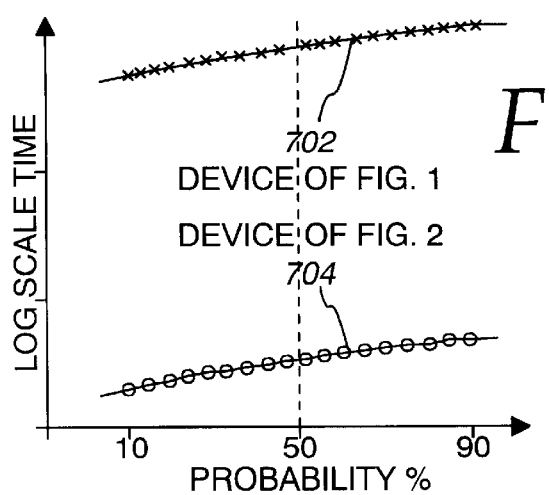
FIG. 7 is a set of curves showing probability of failure for the test structures of FIGS. 1 and 2 without defects over a lifetime distribution.

An improved interconnection test structure for rapidly evaluating electromigration characteristics in a more accurate and reliable manner is disclosed. The instant test structure facilitates the investigation of an interconnection device having metal-filled vias or any type vias with discontinuity of material at the via interface by utilizing high current stress similar to that used in the prior art SWEAT test structure. The results obtained by the interconnection test structure of the present invention can also be used to perform correlation study between high current stress at the wafer-level and low current stress at the assembled package-level for defect detection and material characterization.

Referring now in detail to the drawings, there is shown in FIG. 3 a block diagram of a first embodiment of an interconnection test structure 300 formed on a semiconductor integrated circuit wafer (not shown), constructed in accordance with the principles of the present invention. The interconnection test structure 300 is used for evaluation of electromigration induced failure of a thin metal conductor with vias that is typical of thin metal conductors used in multiple level integrated circuits which are susceptible to failure due to electromigration when the metal conductors are stressed by electric current. The test structure 300 includes an elongated metal test conductor or line 302 which is connected at each end to small extension metal conductors 303, 305 through vias 324. Larger extension conductors 304 and 306 are coupled to an external current source 308 via test or bond pads 310, 312 for applying electrical stressing currents to the test conductor 302. The test conductor 302 has a length dimension $L_L$ preferably of about 800 $\mu$m, a width dimension $W_L$ preferably of approximately 0.5 $\mu$m, and a thickness $T_L$ of about 1 $\mu$m.

A pair of narrow transverse conductors 314 and 316 are provided which are located on the same level as the larger extension metal conductors 304, 306. The test conductor 302 and the small extension metal conductors 303, 305 through vias 324 are located on a different level than the conductors 304, 306, 314, 316 and are separated therefrom by an interlevel dielectric layer (not shown). In other words, the larger extension metal conductors 304, 306 and the narrow transverse conductors 314, 316 are located on a different planar surface from the test conductor 302 and its associated elements 303, 305. The narrow transverse conductors 314 and 316 are coupled to a grounded volt meter 318 via test or bond pads 320,322 for voltage measurements across the test conductor 302. Further, there are provided a plurality of vias 324 (three are shown) located in the small extension conductors 303, 305 adjacent the ends of the test conductor 302 and extending vertically therefrom so as to form electrical contact between the test conductor 302 and the narrow transverse conductors 314, 316.

The inventor has discovered that by the provision of multiple vias 324 or via redundancy the current crowding effects on the via region of the single via 224 of FIG. 2 can be reduced or eliminated. As a result, when high current stress is applied the electromigration of the test conductor 302 will be the dominant failure mode for any current density range. Unlike the prior art test structure 200 of FIG. 2, the electromigration via failure will not occur before the electromigration test conductor failure since the total current density $\Sigma J_V$ at the vias 324 of FIG. 3 will be equal to the total current density $J_L$ of the test conductor 302. Therefore, the present test structure 300 simulates more precisely the traditional long-term fast electromigration tests (e.g., SWEAT) so as to accurately predict electromigration characteristics under actual assembled package operation.

Initially, prior to the electromigration evaluating tests, the voltmeter 318 is used to measure the resistance of the unstressed test conductor 302 so as to define an "initial" resistance. For the electromigration test, an electrical stressing current having a very high stress current density in the range of 10 mA/$\mu$m$^2$ to 100 mA/$\mu$m$^2$, preferably about 50 mA/$\mu$m$^2$, is applied for a predetermined amount of time to the test conductor 302 via the test pads 310 and 312 by the current source 308 so as to accelerate electromigration. Then, the current source 308 is turned off and the voltage is measured again by the voltmeter 318 via the test pads 320, 322 to determine its resistance.

Next, the current source is turned back on so as to apply another stressing current, and another voltage measurement is again made to determine its resistance. This procedure is repeated over and over until a "failure" occurs in the test conductor 302. A "failure" is typically considered to occur when the resistance value of the test conductor 302 exceeds its original resistance value by 20 percent. However, it should be apparent that other definitions are possible, such as when the test conductor is opened due to a void.

Still with reference to FIG. 3, further details of the test structure 300 can be seen. The test conductor 302 is preferably made of an aluminum or aluminum/alloy material. The length of the narrow transverse conductors 314, 316 is typically about 50 $\mu$m. It will be noted that the larger extension metal conductors 304, 306 flare outwardly adjacent the small extension metal conductors 303, 305 and that the narrow transverse conductors 314, 316 are also connected to the larger extension metal conductors 304, 306 at the point where the flaring starts. As illustrated, there are preferably three vias 324 which are aligned longitudinally so as to be co-linear to the test conductor. The middle via 324 is also generally aligned with the narrow transverse conductors with the other two vias located on either side thereof. In addition, each of the vias 324 is of a rectangular shape in its construction, having a length dimension of $L_V$ and a width dimension of $W_V$. Thus, the area $A_V$ of the via is equal to $L_V \times W_V$.

In order to insure that the current density $J_V$ of the vias will be smaller than the current density $J_L$ of the test line 302, the total area of the vias 324 must be made to be larger than the area of the test line 302. This can be expressed mathematically as follows:

$$A_L = T_L \times W_L < \sum_{i=1}^{n} A_{Vi} \tag{1}$$

where: $T_L$ is the thickness of test line; $W_L$ is the length of test line; $A_{Vi}$ is the area of each via and is equal to $L_V \times W_V$; n is the number of vias.

In FIG. 4, there is shown a second embodiment of an interconnection test structure 400 of the present invention which is quite similar to FIG. 3. For convenience, it will be noted that the current source and voltmeter have been purposely omitted. It can be seen that the pattern of the multiple vias 424 are positioned so as to flare outwardly from each end of the test conductor 402. This pattern thus formed is substantially triangular in shape and is located in the small extension conductors 403, 405. Further, each of the vias 424 is of a square shape in its construction having a length dimension $L_V$ equal to its width dimension $W_V$ ($L_V = W_V$). Thus, the area $A_V$ of the via 424 is equal to $L_V \times L_V$ or $W_V \times W_V$. By substitution into the equation (1) above, there is given:

$$A_L = T_L \times W_L < \sum_{i=1}^{n} L_{Vi} \times L_{Vi} \tag{2}$$

In FIG. 5, there is illustrated a third embodiment of an interconnection test structure 500 of the present invention. For convenience, it will be noted that the current source and voltmeter have been purposely omitted. It can be seen that the pattern of the multiple vias 524 are positioned vertically in the small extension conductors 503, 505 and extend transversely so as to be perpendicular to the test conductor 502 and parallel to the narrow transverse conductors 514, 516. Further, each of the vias 524 is of a circular shape in its construction having a radius r. Thus, the area $A_V$ of the via is equal to $\pi r^2$. Accordingly, by substitution again into equation (1) above there is given:

$$A_L = T_L \times W_L < \sum_{i=1}^{n} \pi r_i^2 \tag{3}$$

In FIG. 6, there is depicted a fourth embodiment of an interconnection test structure 600 of the present invention, which is also quite similar to FIG. 3. Again, it will be noted that the current source and voltmeter have been purposely omitted. It can be seen that the pattern of the vias 624 are positioned in the small extension conductors 603, 605 so as to be aligned longitudinally with the test conductor 602. Further, each of the vias 624 is also circular in shape like in FIG. 5.

In FIG. 7, there is shown a set of curves 702, 704 which can be used to compare the probability of failure for the respective test structures 100, 200 of FIGS. 1 and 2 without defect over a lifetime distribution. In particular, the curve 702 shows probability of failure versus time from experimental results obtained on the test structure 100 having high stress current applied. Similarly, the curve 704 shows the probability of failure versus time from experimental results obtained on the test structure 200 having high stress current applied. While the time to failure on the test structure 100 is longer than the failure time on the test structure 200, the failure on the test structure 200 is due to the electromigration failure of the via rather than the electromigration failure of the test line, as was previously pointed out. Thus, the electromigration test utilizing the test structure 200 cannot be used to accurately predict electromigration characteristics of actual devices having vias in operation.

Figure 8:
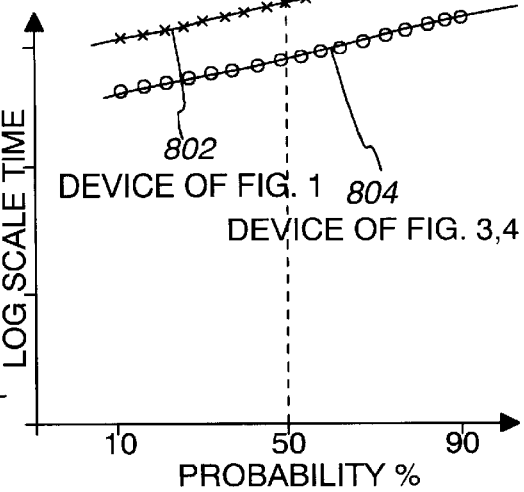
FIG. 8 is a set of curves showing probability of failure for the test structures of FIGS. 3 and 4 without defects over a life time distribution.

In FIG. 8, there is shown a set of curves 802, 804 which compares the probability of failure over a lifetime distribution for the respective conventional test structure 100 without defect of FIG. 1 and the test structure 300, 400 without defect of the present invention in FIGS. 3 and 4. The curve 802 is identical to the curve 702 of FIG. 7. The curve 804 illustrates the probability of failure versus time from experimental results obtained on the test structures 300, 400 having high stress current applied thereto. It will be noted that the curve 804 follows more closely the curve 802 than the curve 704 of FIG. 1. This means that the test structure of FIGS. 3 and 4 simulate more accurately the conventional test structure 100 of FIG. 1 and thus can be used to predict accurately the electromigration characteristics of an actual device having vias under operating conditions.

Figure 9:
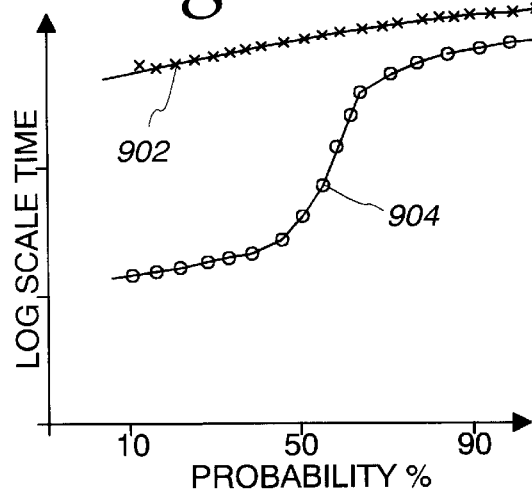
FIG. 9 is a set of curves showing probability of failure for the test structure of FIG. 1 with no defects and with defects.

In FIG. 9, there is illustrated a set of curves 902, 904 which can be used to compare the probability of failure of the test structure 100 of FIG. 1 without defects and with defects. Specifically, the curve 902 is again identical to the curve 702 of FIG. 1. The curve 904 illustrates the probability of failure versus time from experimental results obtained on the test structure 100 of FIG. 1 with defects when high stress currents are applied. As can be seen, the curve 904 exhibits a bimodal behavior in its distribution between the 50 percent and 90 percent failure rate. Therefore, this type of distribution is a signature that a defect exists in the material of the test structure and can be easily recognized.

Figure 10:
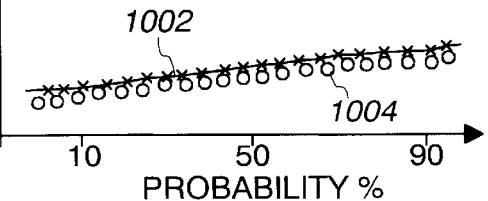
FIG. 10 is a set of curves showing probability of failure for the test structure of FIG. 2 without defects and with defects.

Further, there is depicted in FIG. 10 a set of curves 1002, 1004 which can be used to compare the probability of failure of the test structure 200 of FIG. 2 without defects and with defects. The curve 1002 is identical to the curve 704 in FIG. 7. The curve 1004 depicts the probability of failure versus time from experimental results obtained on the test structure 200 of FIG. 2 with defects when high stress currents are applied. It will be noted that the curve 1004 is substantially co-linear with the curve 1002. Thus, there is very little difference between the two curves 1002 and 1004. As a consequence, this further demonstrates that the test structure 200 of FIG. 2 cannot be used to provide accurate electromigration characteristics of an actual device having a via (filled with a tungsten plug or barrier material).

Figure 11:
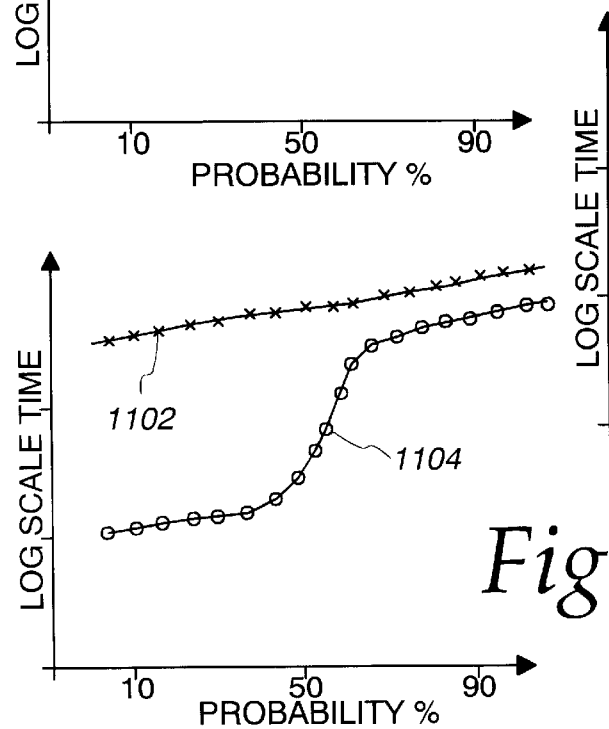
FIG. 11 is a set of curves showing probability of failure for the test structures of FIGS. 3 and 4 without defects and with defects.

Finally, there is depicted in FIG. 11 a set of curves 1102, 1104, which can be used to compare the probability of failure of the test structures 300, 400 of FIGS. 3 and 4 without defects and with defects. Again, the curve 1102 is identical to the curve 804 of FIG. 8. The curve 1104 depicts the probability of failure versus time from experimental results obtained on the test structures 300, 400 of FIGS. 3 and 4 with defects when high stress currents are applied. As can be seen, the curve 1104 exhibits again a bimodal behavior in its distribution between the 50 percent and 90 percent failure rate. Accordingly, it can be easily determined when a defect occurs in the test structure.

The interconnection test structures of the present invention have the following advantages over the prior art:

(1) it simulates more accurately the conventional long-time test structure of FIG. 1 since the failure mode will be dominated by the line electromigration rather than the via electromigration;

(2) it permits investigation of a metal conductor using high current stress for the case of an interconnection device having vias; and (3) it establishes a close correlation between high current stress at the wafer-level and low current stress at the assembled package level.

From the foregoing detailed description, it can thus be seen that the present invention provides an improved interconnection test structure for evaluating electromigration characteristics in a more accurate and reliable manner. The test structure of the present invention includes an elongated metal test conductor, small extension metal conductors connected to each end of the test conductor, and multiple vias disposed in the small extension metal conductors adjacent the first and second ends of the test conductor.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An interconnection test structure using high stress current for evaluating more accurately and reliably electromigration characteristics, said test structure comprising:

an elongated metal test conductor having a first end and a second end;

small extension metal conductors connected to said first end and said second end of said test conductor, said first end and said second end of said test conductor extending outwardly towards said respective extension metal conductors; and a plurality of vias being disposed in said small extension metal conductors adjacent said first end and said second end of said test conductor so as to cause the current density of said plurality of vias to be less than the current density of said test conductor, whereby failure of the test conductor due to electromigration will occur before failure of the vias due to the electromigration.

2. An interconnection test structure as claimed in claim 1, wherein said test conductor has a length of approximately 800 $\mu$m and a width of about 0.5 $\mu$m.

3. An interconnection test structure as claimed in claim 1, wherein the area of said test conductor is less than the total area of said plurality of vias.

4. An interconnection test structure as claimed in claim 3, wherein each of said plurality of vias is of a rectangular shape in its construction.

5. An interconnection test structure as claimed in claim 3, wherein each of said plurality of vias is of a square shape in its construction.

6. An interconnection test structure as claimed in claim 3, wherein each of said plurality of vias is of a circular shape in its construction.

7. An interconnection test structure as claimed in claim 1, wherein said vias are located in said small extension metal conductors adjacent said first and second ends of said test conductor and are aligned longitudinally to be co-linear to said test conductor.

8. An interconnection test structure as claimed in claim 1, wherein said vias are located in said small extension metal conductors adjacent the first and second ends of said test conductor and are aligned vertically so as to be perpendicular to said test conductor.

9. An interconnection test structure as claimed in claim 1, wherein said plurality of vias extend outwardly from the first and second ends of said test conductor and flare outwardly into said extension conductors in a triangular pattern.

10. An interconnection test structure as claimed in claim 1, further comprising means for applying an electrical current through said test conductor via said extension metal conductors.

11. An interconnection test structure as claimed in claim 10, wherein said electrical current has a current density in the range of 10 mA/$\mu$m$^2$ to 100 mA/$\mu$m$^2$.

12. An interconnection test structure as claimed in claim 11, wherein said current density is approximately 50 mA/$\mu$m$^2$.

13. An interconnection test structure as claimed in claim 12, further comprising means for measuring resistance of said test conductor after the application of the electrical current.

14. An interconnection test structure as claimed in claim 1, wherein said test conductor is made of an aluminum material.

15. An interconnection test structure as claimed in claim 1, wherein said test conductor is formed of an aluminum-alloy material.

* * * * *